United States Patent
Chen et al.

(10) Patent No.: US 8,729,588 B2
(45) Date of Patent: May 20, 2014

(54) LIGHT EMITTING DIODE ELEMENT

(71) Applicant: Lextar Electronics Corporation, Hsinchu (TW)

(72) Inventors: Jun-Rong Chen, Taichung (TW); Jhao-Cheng Ye, Yunlin County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/658,813

(22) Filed: Oct. 23, 2012

(65) Prior Publication Data

US 2013/0292722 A1 Nov. 7, 2013

(30) Foreign Application Priority Data

May 4, 2012 (TW) .............................. 101116041 A

(51) Int. Cl.
*H01L 33/58* (2010.01)

(52) U.S. Cl.
USPC ..................................... 257/98; 257/E33.074

(58) Field of Classification Search
CPC ................................ H01L 51/56; H01L 33/58
USPC .............................................. 257/98; 438/29
See application file for complete search history.

(56) References Cited

U.S. PATENT DOCUMENTS

| | | | | |
|---|---|---|---|---|
| 2004/0021147 | A1* | 2/2004 | Ishibashi et al. | 257/103 |
| 2008/0251803 | A1* | 10/2008 | Cho et al. | 257/94 |
| 2008/0303047 | A1* | 12/2008 | Shen et al. | 257/98 |
| 2010/0283075 | A1* | 11/2010 | McKenzie et al. | 257/98 |
| 2011/0057207 | A1* | 3/2011 | Su et al. | 257/88 |
| 2011/0089456 | A1* | 4/2011 | Andrews et al. | 257/98 |
| 2013/0005060 | A1* | 1/2013 | Lo et al. | 438/29 |

FOREIGN PATENT DOCUMENTS

| | | |
|---|---|---|
| TW | 535300 B | 6/2003 |
| TW | 200739692 | 10/2007 |

* cited by examiner

*Primary Examiner* — Kimberly Rizkallah
*Assistant Examiner* — Mounir Amer
(74) *Attorney, Agent, or Firm* — CKC & Partners Co., Ltd.

(57) ABSTRACT

The present invention provides a light emitting diode (LED) element which comprises a substrate, a buffer layer, a plurality of nano-spheres and a light emitting structure. The substrate comprises a plurality of grooves arranged at intervals on a surface of the substrate. The buffer layer is disposed on the surface of the substrate where the grooves being formed, wherein the grooves are disposed between the substrate and the buffer layer. The nano-spheres are received in the grooves, so each groove is provided with at least a nano-sphere. The light emitting structure is disposed on the buffer layer.

20 Claims, 15 Drawing Sheets

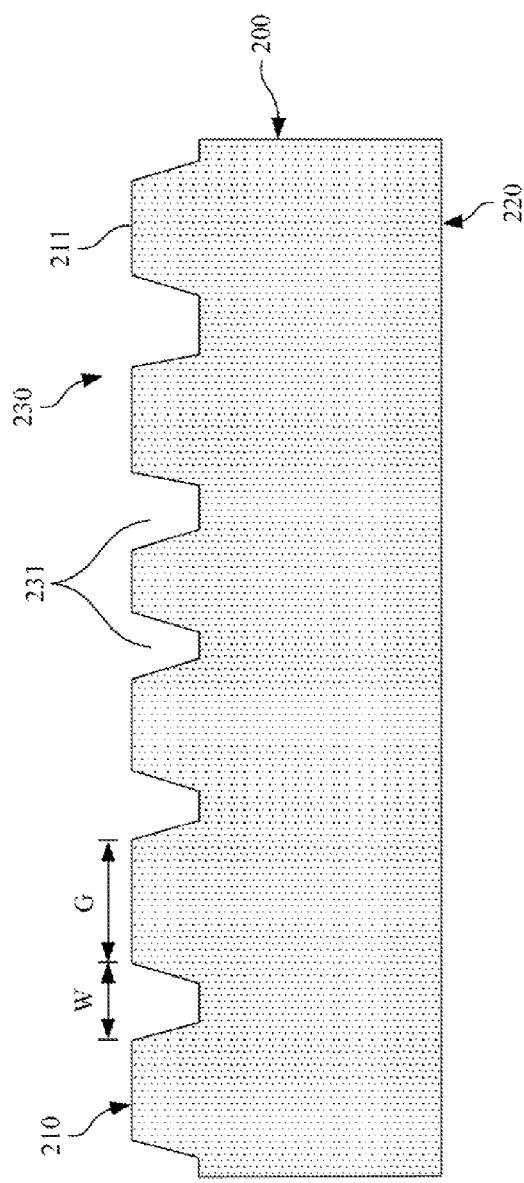
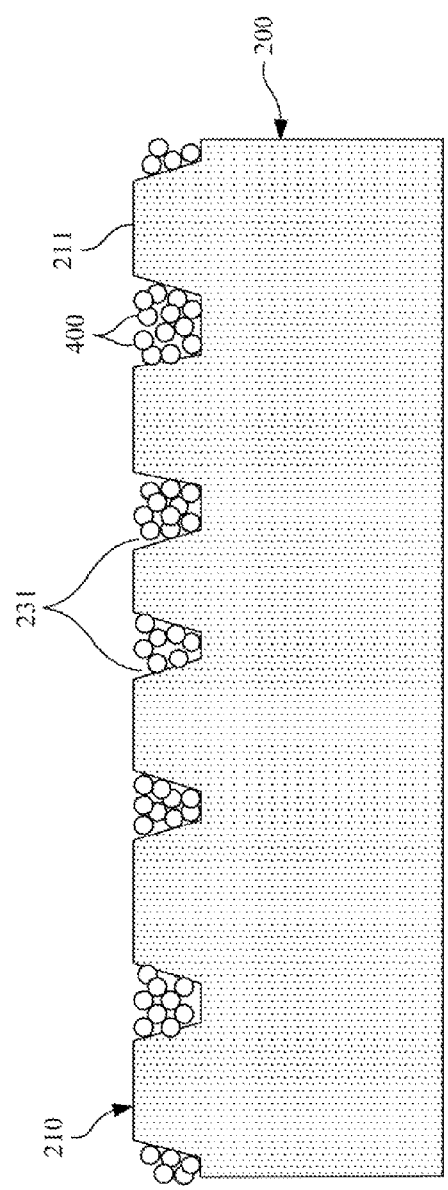

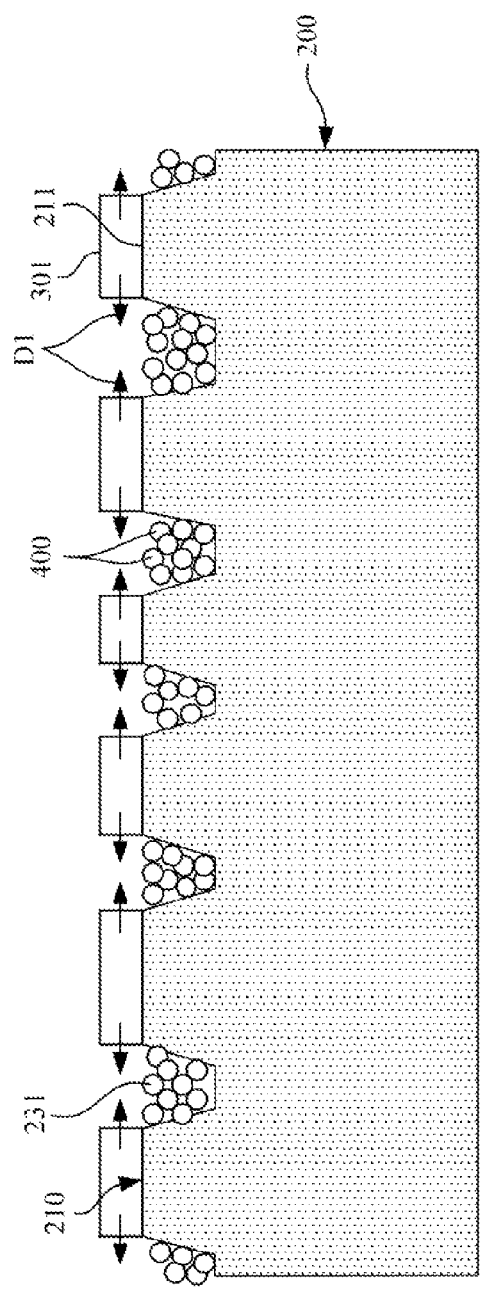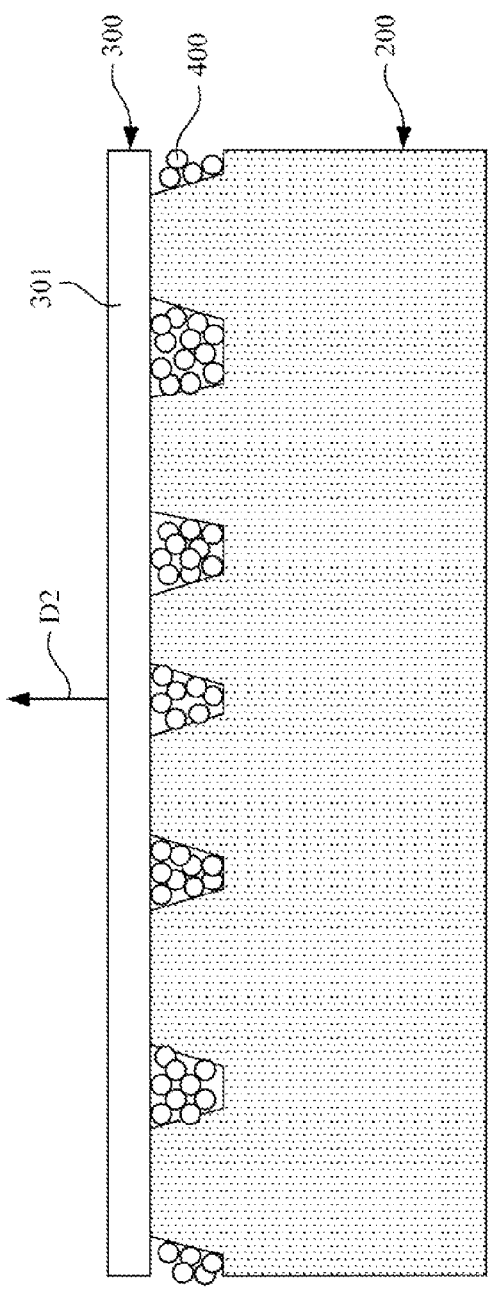

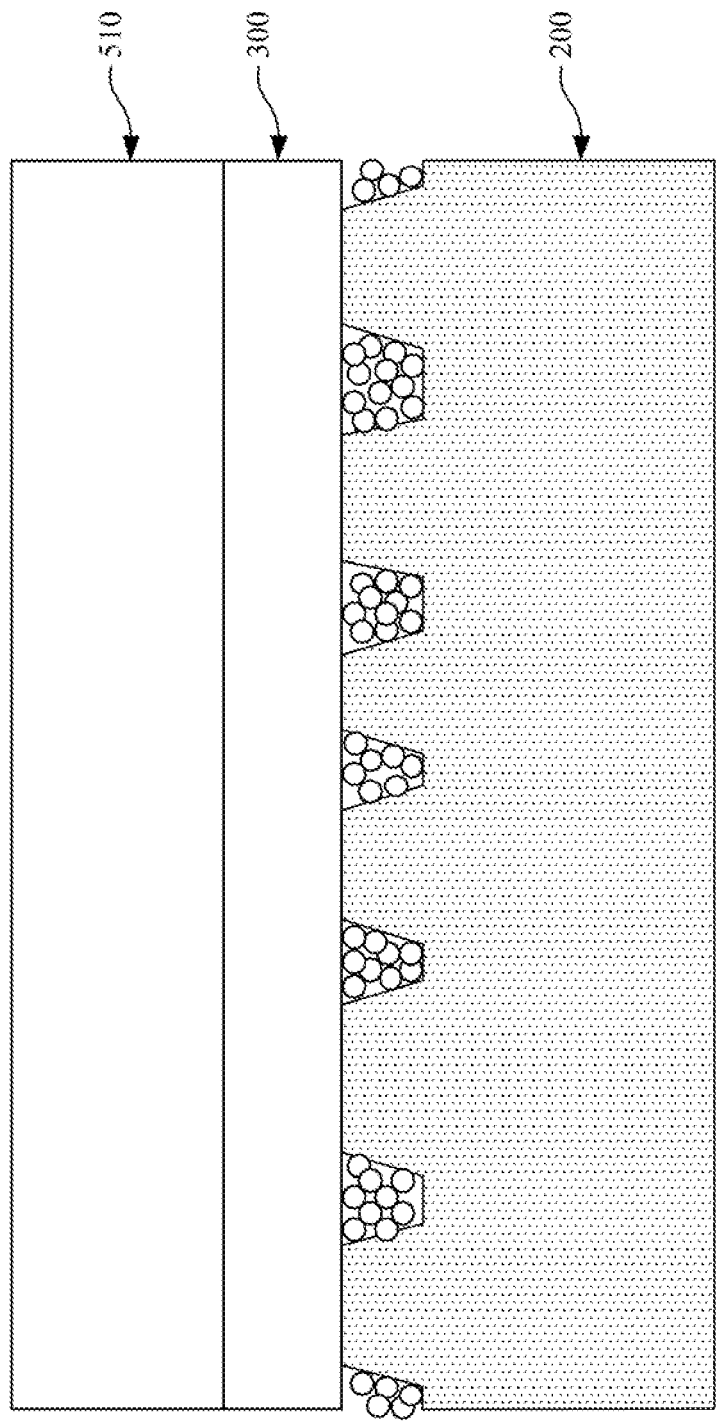

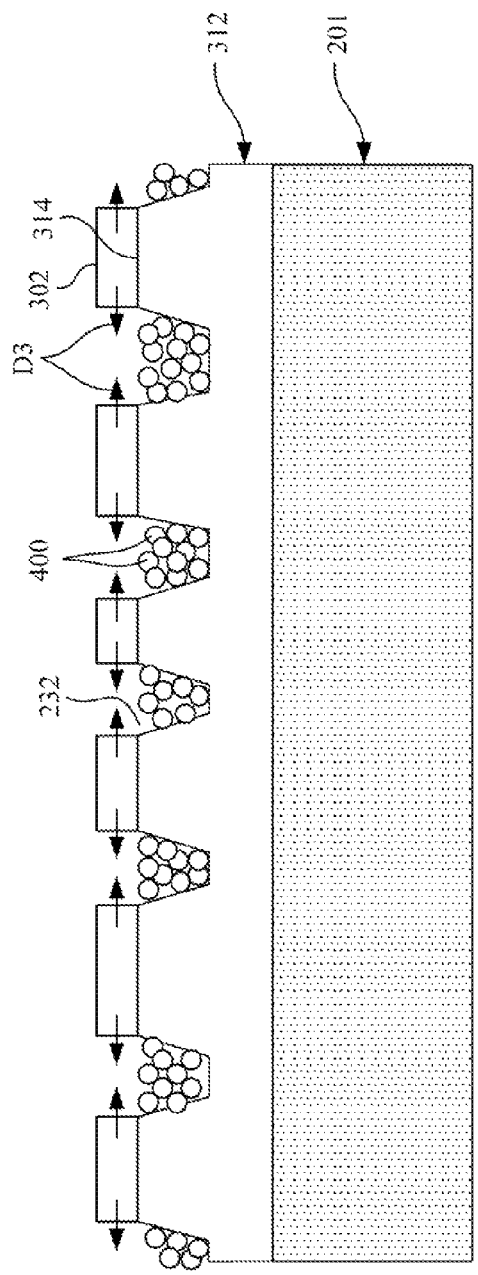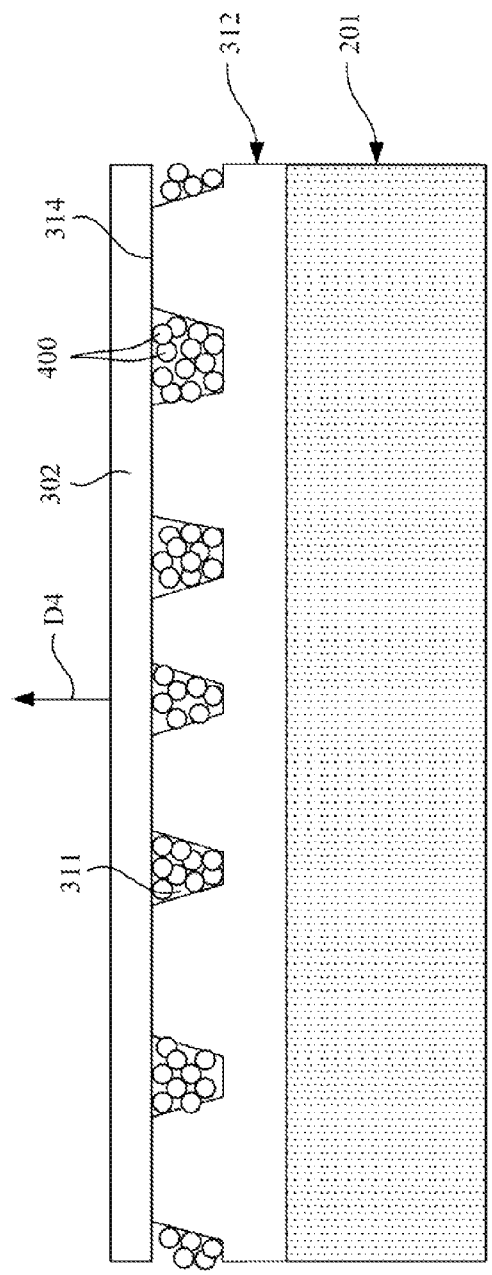

LIGHT EMITTING DIODE ELEMENT

RELATED APPLICATIONS

This application claims priority to Taiwan Application Serial Number 101116041 filed May 4, 2012, which is herein incorporated by reference.

BACKGROUND

1. Technical Field

The present invention relates to a light emitting diode element, and more particularly to a light emitting diode element having nano-spheres.

2. Description of Related Art

The light emitting diode (LED) is categorized as one of the compound semiconductors, which outputs energy in a light emitting format while the electro holes of P-type and N-type semiconductor materials being combined. Moreover, in that the LED has advantages of small volume, long service life, low power consumption and fast responding, it has been widely used in like an optical display device, communication device and illumination device, and has become a must-have photoelectric element.

However, confined to the structure of the conventional LED die, the light extraction efficiency of conventional LED die is still limited, and a solution for effectively providing higher light extraction efficiency is yet to be seen.

As what is disclosed above, the conventional LED die still has inconvenience and shortages, thereby requiring an improvement. As such, how to effectively solve the mentioned inconvenience and shortages shall be a serious issue to be concerned.

SUMMARY

The present invention provides a light emitting diode element for effectively increasing the light extraction efficiency and enhancing the whole light output quality, The present invention provides a light emitting diode element which utilizes a transversal epitaxy growth mechanism for enhancing the whole crystals to regularly grow and effectively improving the crystal quality of epitaxy.

According to one solution provided by the present invention, a light emitting diode element comprises a substrate, a buffer layer, a plurality of nano-spheres and a light emitting structure. The substrate comprises a plurality of grooves arranged at intervals on a surface of the substrate. The buffer layer is stacked on the surface of the substrate where the grooves being formed. The grooves are disposed between the substrate and the buffer layer. The nano-spheres are received in the grooves, and each groove is filled with at least one nano-sphere. The light emitting structure is stacked on the buffer layer.

According to another solution provided by the present invention, a light emitting diode element comprises a substrate, a buffer layer, a plurality of nano-spheres and a light emitting structure. One surface of the buffer layer is formed with a plurality of grooves arranged at intervals, and the surface of the buffer layer faces the substrate for stacking on the substrate. The nano-spheres are received in the grooves. The light emitting structure is formed on the buffer layer.

According to another solution provided by the present invention, a light emitting diode element comprises a substrate, a buffer layer, a plurality of nano-spheres and a light emitting structure. The buffer layer is disposed the substrate and formed with a plurality of channels arranged at intervals. The nano-spheres are received in the channels. The light emitting structure is formed on the buffer layer.

According to one embodiment of the aforementioned solutions, the light emitting structure comprises a first semiconductor layer, a light emitting layer TO and a second semiconductor layer. The first semiconductor layer is formed on the buffer layer. The light emitting layer is formed on a part of a surface of the first semiconductor layer, such that a remaining part of the surface of the first semiconductor layer which is not covered by the light emitting layer is exposed. The second semiconductor layer is formed on the light emitting layer.

In the embodiment, the light emitting diode element further comprises a first electrode layer and a second electrode layer. The first electrode layer is formed on the remains of the surface of the first semiconductor layer which is not covered by the light emitting layer. The second electrode layer is formed on the second semiconductor layer. The first semiconductor layer is a N-type gallium-containing nitride semiconductor layer, the second semiconductor layer is a P-type gallium-containing nitride semiconductor layer, or the first semiconductor layer is a P-type gallium-containing nitride semiconductor layer, the second semiconductor layer is a N-type gallium-containing nitride semiconductor layer.

Further, in one option of the embodiment, the grooves or the channels are periodically or non-periodically arranged on the substrate.

In another option of the embodiment, a width of each of the grooves or the channels is 1 µm.

In another option of the embodiment, the interval defined between each of the two adjacent grooves or the channels is 1 µm to 3 µm.

In another option of the embodiment, a light reflection rate of the nano-spheres is greater than 1.

In another option of the embodiment, the nano-spheres are made of a dielectric material, and the dielectric material, for example, is selected from a group consisted of $SiO_x$, $SiN_x$, $SiOH_x$, ceramics and $TiO_x$.

In another option of the embodiment, a diameter of each of the nano-spheres is between 100 nm to 500 nm, more specifically, the diameter of each of the nano-spheres is between 160 nm to 180 nm.

In another option of the embodiment, a wavelength of the output light beam emitted from the light emitting structure is between 450~500 nm.

As what has been disclosed above, the solution provided by the present invention has obvious advantage and practicability while comparing the conventional arts, therefore the present invention can be widely applied in various industries, and has at least following advantages:

1. With the installation of the nano-spheres, the light emitting diode element of the present invention can provide a better light scattering effect, thereby increasing the light extraction efficiency and enhancing the whole light output quality.

2. The nano-spheres disposed in the buffer layer of the light emitting diode element of the present invention are closer to the light emitting structure, thereby increasing the light extraction efficiency in a more effective manner.

3. With the installation of the nano-spheres, a transversal epitaxy growth mechanism is formed in the light emitting diode element of the present invention, thereby enhancing the whole crystals to regularly grow, lowering the possibilities of generating crystal defect, and effectively improving the crystal quality of epitaxy.

4. With the nano-spheres being received in the grooves, air gaps are inevitably formed, thereby altering the light reflection rate and increasing the light scattering effect.

BRIEF DESCRIPTION OF THE DRAWINGS

The present invention will be apparent to those skilled in the art by reading the following detailed description of a preferred embodiment thereof, with reference to the attached drawings, in which:

FIG. 2A to FIG. 2G are schematic operational views illustrating the manufacturing procedure of the light emitting diode element according to the first embodiment of the present invention;

FIG. 4A to FIG. 4G are schematic operational views illustrating the manufacturing procedure of the light emitting diode element according to the second embodiment of the present invention;

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In view of the limited light extraction efficiency of a conventional light emitting diode (LED) die, the present invention adopts nano-spheres in a light emitting diode element for enhancing the light scattering, so the nano-spheres arranged at intervals can generate more light scattering centers for providing a better light scattering effect; meanwhile, a transversal epitaxy growth mechanism can be formed in the light emitting diode element due to the installation of the nano-spheres, thereby enhancing the whole crystals to regularly grow, lowering the possibilities of generating crystal defect, and effectively improving the crystal quality of epitaxy.

Figure 1:
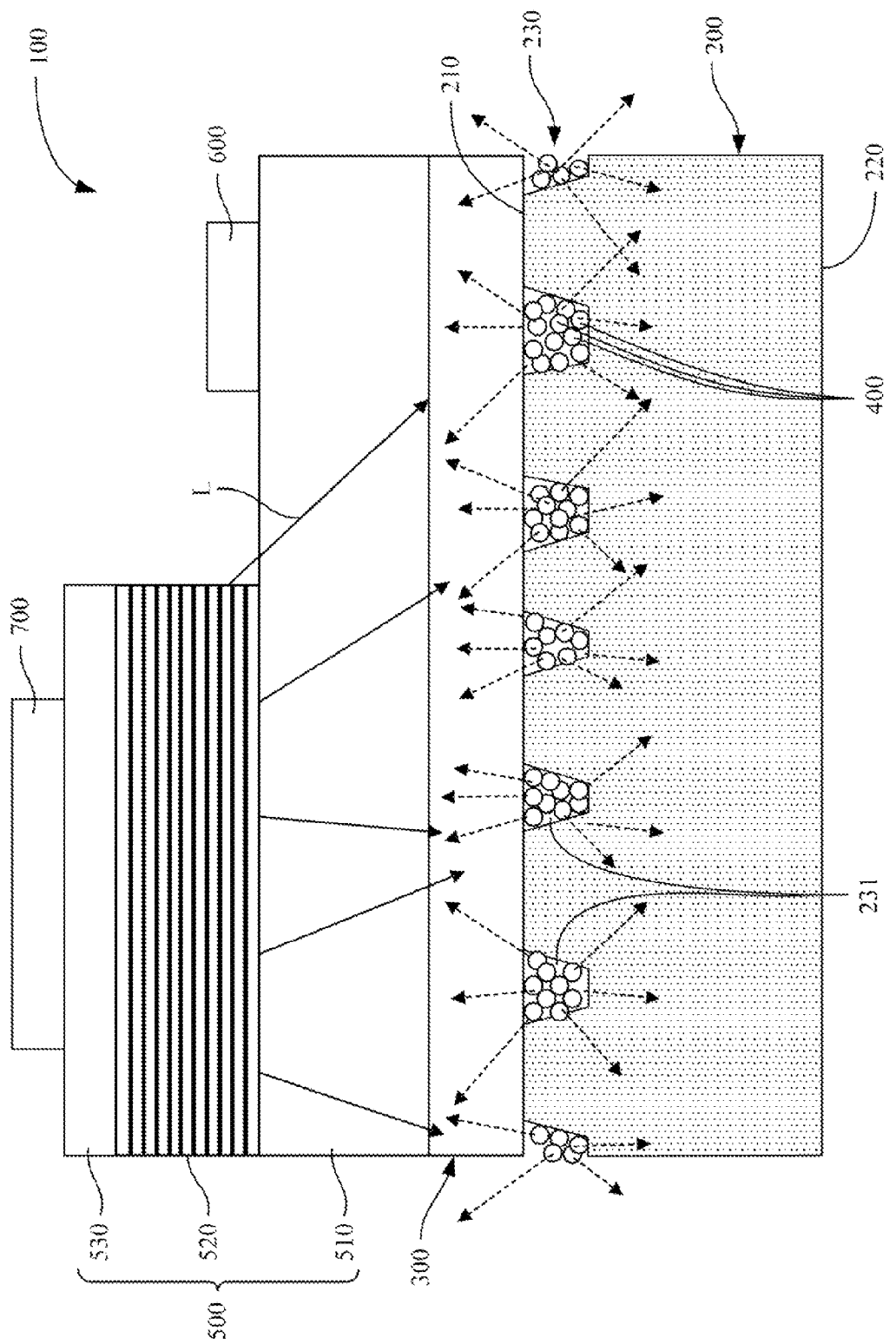
FIG. 1 is a side view showing the light emitting diode element according to a first embodiment of the present invention.

Reference is first made to FIG. 1. FIG. 1 is a side view showing the light emitting diode element 100 according to a first embodiment of the present invention.

The present invention provides a LED element 100. The LED element 100 (or LED die) comprises a substrate 200, a buffer layer 300, a plurality of nano-spheres 400 and a light emitting structure 500. The buffer layer 300 is stacked on a surface of the substrate 200, the light emitting structure 500 is stacked on the surface of the buffer layer 300 opposite to the substrate 200, and the nano-spheres 400 are arranged in groups and at intervals on the surface of the substrate 200 which faces the buffer layer 300.

According to the first embodiment, the substrate 200 can be e.g. a sapphire substrate or a gallium nitride (GaN) substrate; however, the scope of the present invention is not limited by the mentioned substrates which only serve for illustration.

The substrate 200 comprises a top surface 210 and a bottom surface 220 opposite to the top surface 210. The top surface 210 of the substrate 200 is formed with a three-dimensional pattern 230. The three-dimensional pattern 230 comprises a plurality of grooves 231 concavely formed on the top surface 210 of the substrate 200. The grooves 231 are arranged at intervals on the top surface 210 of the substrate 200, furthermore, the grooves 231 can be periodically or non-periodically arranged on the top surface 210 of the substrate 200.

The buffer layer 300 is e.g. a gallium nitride (GaN) layer, preferably a low-temperature gallium nitride (GaN) layer disposed on the top surface 210 of the substrate 200 and having the same area as the top surface 210 of the substrate 200, so that the grooves 231 is disposed between the substrate 200 and the buffer layer 300 and is covered by the buffer layer 300.

According to the first embodiment, in FIG. 2A, each groove 231 can be defined as a micrometer-class groove having the width W such as 1 μm in which the width W is smaller than the interval G, e.g. 2 μm~3 μm, defined between every two adjacent grooves 231. However the scope of the present invention is not limited to the disclosure, the width W of each groove 231 and the interval G defined between every two adjacent grooves 231 can be determined according to actual needs.

Referring to FIG. 1 again, the mentioned nano-spheres 400 are substantially defined as in the nano size, so the nano-spheres 400 can also be named as nano-class spheres or microspheres. As such, the nano-spheres 400 can be in groups to be respectively disposed in the grooves 231, so each groove 231 can be filled with one or more nano-spheres 400.

The nano-spheres 400 are made of dielectric material, e.g. a combination of $SiO_x$, $SiN_x$, $SiO_x$, ceramics and $TiO_x$.

In addition, the diameter of each nano-sphere 400 is e.g. between 100 nm to 750 nm; preferably, the diameter of each nano-sphere 400 is between 100 nm to 500 nm; furthermore, the diameter of each nano-sphere 400 can be between 160 nm to 180 nm. The diameter of each nano-sphere 400 is similar to the wavelength of an output light beam emitted from the light emitting structure 500, according to one preferred embodiment of the present invention, the wavelength of the output light beam emitted from the light emitting structure 500 is e.g. between 450~500 nm.

Moreover, the light emitting structure 500 comprises a first semiconductor layer 510, a light emitting layer 520 and a second semiconductor layer 530. The first semiconductor layer 510 is formed on the surface of the buffer layer 300 opposite to the substrate 200. The light emitting layer 520 is partially formed on the first semiconductor layer 510, so that the remain part of the first semiconductor layer 510 which is not covered by the light emitting layer 520 can be exposed outwardly. The second semiconductor layer 530 is formed on the surface of the light emitting layer 520 opposite to the first semiconductor layer 510. According to this embodiment, the light emitting layer 520 is not limited to a single-quantum well (SQW) or multi-quantum wells (MQWs) light emitting layer 520. The LED element 100 further comprises a first electrode layer 600 and a second electrode layer 700. The first electrode layer 600 is formed on the part of the first semiconductor layer 510 which is not covered by the light emitting layer 520. The second electrode layer 700 is formed on the second semiconductor layer 530.

According to one alternative of the first embodiment, the first semiconductor layer 510 is a N-type gallium-containing nitride semiconductor layer, the second semiconductor layer 530 is a P-type gallium-containing nitride semiconductor layer; or the first semiconductor layer 510 is a P-type gallium-containing nitride semiconductor layer, the second semiconductor layer 530 is a N-type gallium-containing nitride semiconductor layer.

So when the light emitting structure 520 emits light beams L to the nano-spheres 400 in each groove 231, because there are gaps formed between the nano-spheres 400 which are respectively disposed in the grooves 231, the light reflection rate of the nano-spheres 400 is greater than 1, so as to allow the nano-spheres 400 to have different light refection rate from the air, to enable the nano-spheres 400 to generate more light scattering centers, and to provide a better light scattering effect and enhance the whole light output quality.

Table 1 shown below compares the electroluminescence (EL) intensity of a conventional LED element and the LED element 100 having nano-spheres 400 in different diameters.

TABLE 1

|  | EL intensity at 20 mA (arbitrary unit) |
| --- | --- |
| Conventional LED element having no nano-sphere | 68.6 |
| LED element having nano-spheres (250 nanometer in diameter) | 91.6 |
| LED element having nano-spheres (500 nanometer in diameter) | 80.6 |
| LED element having nano-spheres (750 nanometer in diameter) | 73.1 |

According to the data shown in Table 1, the EL intensity of the conventional LED element having no nano-sphere is only 68.6; according to the present invention, while the LED element 100 having nano-spheres 400 with 250 nanometer (nm) in diameter, the EL intensity is the highest and reaches the value of 91.6; while the LED element 100 having nano-spheres 400 with 500 nanometer (nm) in diameter, the EL intensity is the second highest and reaches the value of 80.6; while the LED element 100 having nano-spheres 400 with 750 nanometer (nm) in diameter, the EL intensity is also great and reaches the value of 73.1. As such, no matter the LED element 100 having the nano-spheres 400 with 250, 500 or 750 nanometer (nm) in diameter, the EL intensity values are all greater than that of the conventional LED element.

Reference is now made to FIG. 2A to FIG. 2G. FIG. 2A to FIG. 2G are schematic operational views illustrating the manufacturing procedure of the LED element 100 according to the first embodiment of the present invention.

According to the first embodiment, the manufacturing procedure of the LED element 100 substantially comprises Step (801) to (807), as outlined below.

In Step (801), the mentioned substrate 200 is prepared (as shown in FIG. 2A). In this step, if the substrate 200 is a sapphire substrate, the mentioned grooves 231 can be formed on the top surface 211 of the substrate 200 through a photo etching means; or, if the substrate 200 is a gallium nitride substrate, the mentioned grooves 231 can be formed on the top surface 211 of the substrate 200 through a lithography etching means.

In Step (802), the mentioned nano-spheres 400 are arranged in each groove 231 (as shown in FIG. 28). In this step, the nano-spheres 400 are in groups to be respectively disposed in each groove 231, and the detailed steps further comprise Step (8021) to Step (8024).

In Step (8021), a solution containing the nano-spheres 400 is applied on the top surface 210 of the substrate 200;

In Step (8022), the substrate 200 is rotated for making the nano-spheres 400 to respectively fall in the grooves 231;

In Step (8023), the residual nano-spheres 400 is brushed on the top surface 210 of the substrate 200 for removing the residual nano-spheres 400, wherein several nano-spheres 400 may he pushed to fall into the grooves 231 during the removing process; and In Step (8024), the solution is expected to be evaporated from the substrate 200.

Figure 2E:
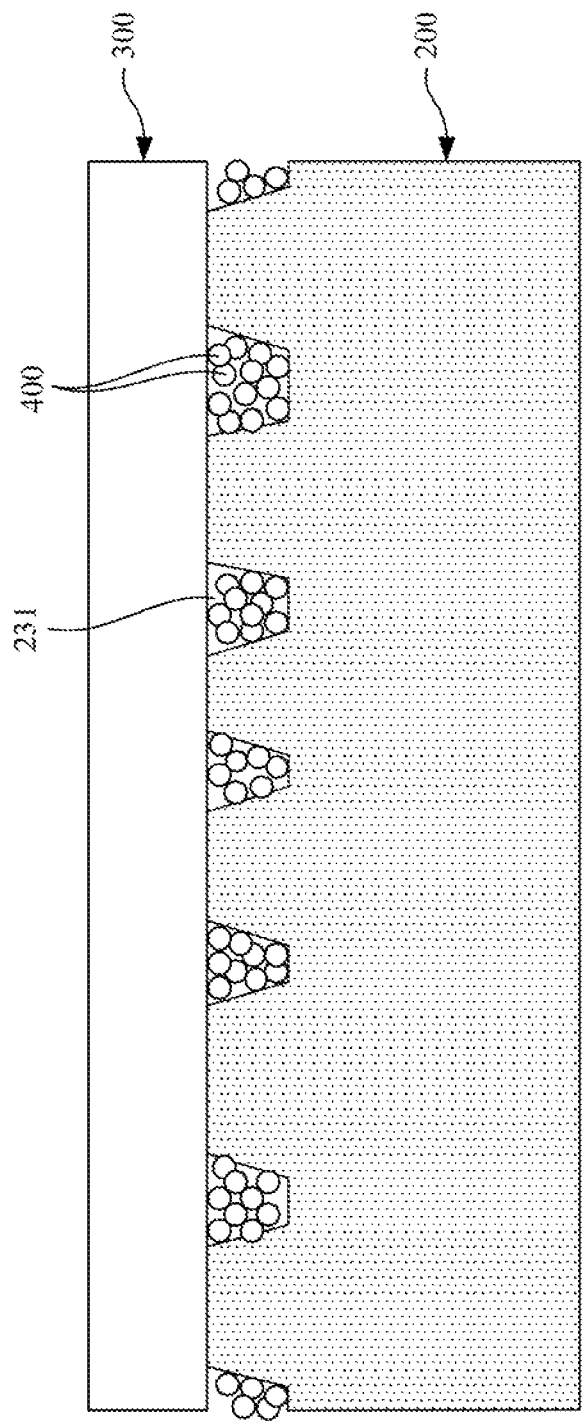

In Step (80 the motioned buffer layer 300 is formed on the top surface 210 of the substrate 200 in which the buffer layer 300 covers the grooves 231, the nano-spheres 400 and the substrate 200 (as shown from FIG. 2C to FIG. 2E). Substantially, because the grooves 231 of the substrate 200 have already been provided with the nano-spheres 400, a plurality of first crystal growing surfaces 211 are formed at the staggering locations defined by the top surface 210 of the substrate 200 and the grooves 231, the buffer layer 300 is only allowed to epitaxy on the first crystal growing surfaces 211 During the epitaxy process of the buffer layer 300, initial crystals 301 of the buffer layer 300 are respectively and transversally grown towards two opposite sides (see the crystal growing direction D1 towards left and right as shown in FIG. 2C) on the first crystal growing surfaces 211 of the substrate 200, after the crystals 301 are transversally grown and formed as one piece (as shown in FIG. 2D), the crystals 301 are jointly grown towards the direction opposite to the substrate 200 as the crystal growing direction D2 shown in FIG. 20, so as to form the buffer layer 300 (as shown in FIG. 2E). As such, with the transversal epitaxy mechanism, the regular growth of the whole crystals of buffer layer 300 can be enhanced so as to effectively improve the crystal quality of epitaxy.

In Step (804), the mentioned first semiconductor layer 510 is formed on the surface of the buffer layer 300 opposite to the substrate 200 (as shown in FIG. 2F).

Figure 2G:
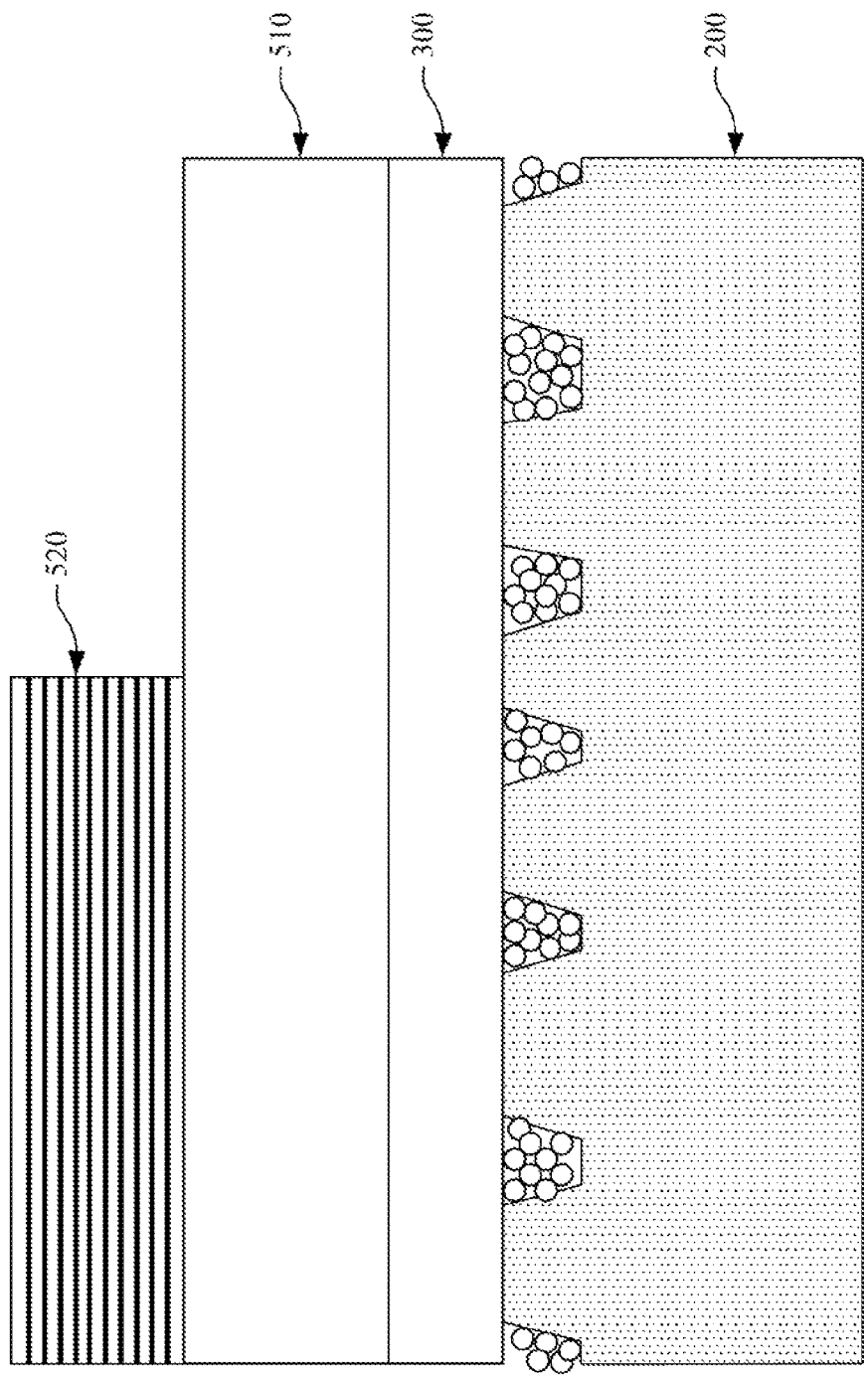

In Step (805), the mentioned light emitting layer 520 is formed on the surface of the first semiconductor layer 510 opposite to the substrate 200 (as shown in FIG. 2G).

In Step (806), the mentioned second semiconductor layer 530 is formed on the surface of the light emitting layer 520 opposite to the substrate 200 (as shown in FIG. 1).

In Step (807), the mentioned first electrode layer 600 is formed on the first semiconductor layer 510, and the mentioned second electrode layer 700 is formed on the second semiconductor layer 530, respectively (as shown in FIG. 1). Accordingly, with the disclosed steps, the LED element 100 of the first embodiment can be formed.

Figure 3:
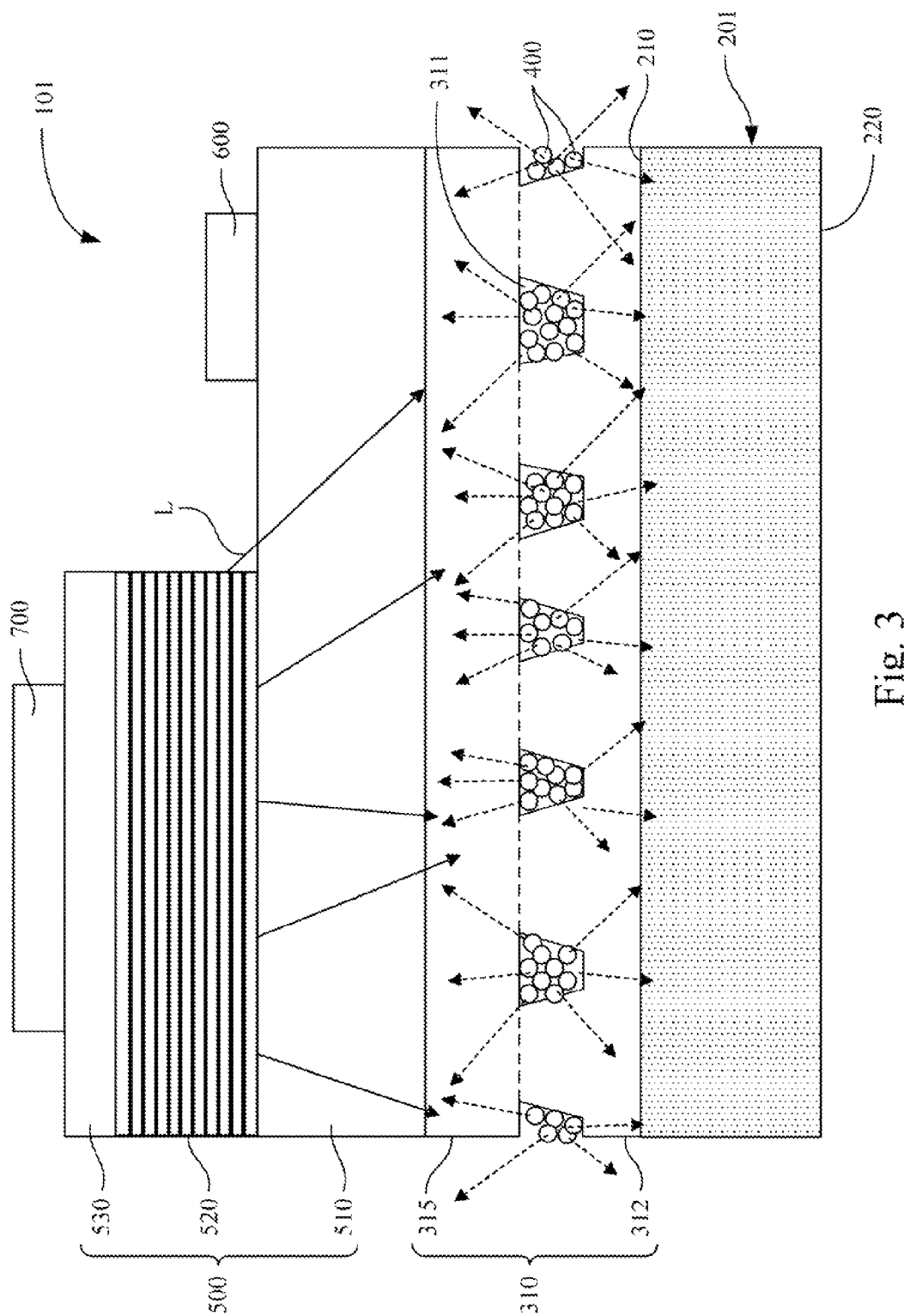
FIG. 3 is a side view showing the light emitting diode element according to a second embodiment of the present invention.

FIG. 3 is a side view showing the LED element 101 according to a second embodiment of the present invention.

The present invention provides a LED element 101. The LED element 101 (or LED die) comprises a substrate 201, a buffer layer 310, a plurality of nano-spheres 400 and a light emitting structure 500. The buffer layer 310 is disposed on the substrate 201, and a plurality of channels horizontally arranged at intervals is formed inside the buffer layer 310. The nano-spheres 400 are received in the channels 311. The light emitting structure 500 is formed on the buffer layer 310.

According to the second embodiment, the substrate 201 can be e.g. a sapphire substrate or a gallium nitride (GaN) substrate, however, the scope of the present invention is not limited by the mentioned substrates which only serve for illustration. The buffer layer 310 is e.g. a gallium nitride (GaN) layer disposed on a top surface 210 of the substrate 201 and having the same area as the top surface 210 of the substrate 201, The channels 311 are hidden in the buffer layer 310, and periodically or non-periodically arranged in the buffer layer 310; in other words, the channels 311 are periodically or non-periodically arranged above the substrate 201.

According to the second embodiment, each channel 311 can be defined as a micrometer-class channel having the width W such as 1 μm in which the width W is smaller than the interval G, e.g. 2 μm~3 μm, defined between every two adjacent channels 311. However, the scope of the present invention is not limited to the disclosure, the width W of each channel 311 and the interval G defined between every two adjacent channels 311 can be determined according to actual needs.

Substantially, the mentioned nano-spheres 400 are substantially defined as in the nano size, so the nano-spheres 400 can also be named as nano-class spheres or microspheres. As such, the nano-spheres 400 can be in groups to be respectively disposed in the channels 311, so each channel 311 can be filled with one or more nano-sphere 400.

The nano-spheres 400 are made of dielectric material, e.g. a combination of $SiO_x$, $SiN_x$, $SiOH_x$, ceramics and $TiO_x$.

In addition, the diameter of each nano-sphere 400 is e.g. between 100 nm to 750 nm; preferably, the diameter of each nano-sphere 400 is between 100 nm to 500 nm; furthermore, the diameter of each nano-sphere 400 can be between 160 nm to 180 nm. The diameter of each nano-sphere 400 is similar to the wavelength of the output light beam emitted from the light emitting structure 500, wherein the wavelength of the output light beam emitted from the light emitting structure 500 is e.g. between 450~500 nm.

The light emitting structure 500, the first electrode layer 600 and the second electrode layer 700 are the same as what have been disclosed in the first embodiment, and are provided with the same numeral references, therefore no further illustration is provided.

Thus, when the light emitting layer 520 emits light beams L to the nano-spheres 400 in each channel 311, because there are gaps formed between the nano-spheres 400 which are respectively disposed in the channels 311 the light reflection rate of the nano-spheres 400 is greater than 1, so as to allow the nano-spheres 400 to have different light refection rate from the air, to enable the nano-spheres 400 to generate more light scattering centers, and to provide a better light scattering effect and enhance the whole light output quality. Moreover, comparing with the first embodiment, the nano-spheres 400 disclosed in the second embodiment are closer to the light emitting structure 500, thereby capable of increasing the light extraction efficiency in a more effective manner.

Table 2 shown below compares the EL intensity of a conventional LED element and the LED element 101 having nano-spheres 400 in different diameters.

TABLE 2

| | EL intensity at 20 mA (arbitrary unit) |
|---|---|
| Conventional LED element having no nano-sphere | 72.54 |
| LED element having nano-spheres (250 nanometer in diameter) | 96.51 |
| LED element having nano-spheres (500 nanometer in diameter) | 88.81 |
| LED element having nano-spheres (750 nanometer in diameter) | 76.72 |

According to the data shown in Table 2, the EL intensity of the conventional LED element having no nano-sphere is only 72.54; according to the present invention, while the LED element 101 having nano-spheres 400 with 250 nanometer (nm) in diameter, the EL intensity is the highest and reaches the value of 96.51; while the LED element 101 having nano-spheres 400 with 500 nanometer (nm) in diameter, the EL intensity is the second highest and reaches the value of 88.81; while the LED element 101 having nano-spheres 400 with 750 nanometer (nm) in diameter, the EL intensity is also great and reaches the value of 76.72. As such, no matter the LED element 101 having the nano-spheres 400 with 250, 500 or 750 nanometer (nm) in diameter, the EL intensity values are all greater than that of the conventional LED element.

Reference is now made to FIG. 4A to FIG. 4G. FIG. 4A to FIG. 4G are schematic operational views illustrating the manufacturing procedure of the LED element 101 according to the second embodiment of the present invention.

According to the second embodiment, the manufacturing procedure of the LED element 101 substantially comprises Step (901) to (908), as outlined below. In Step (901), the mentioned substrate 201 is prepared (as shown in FIG. 4A).

Figure 4A:
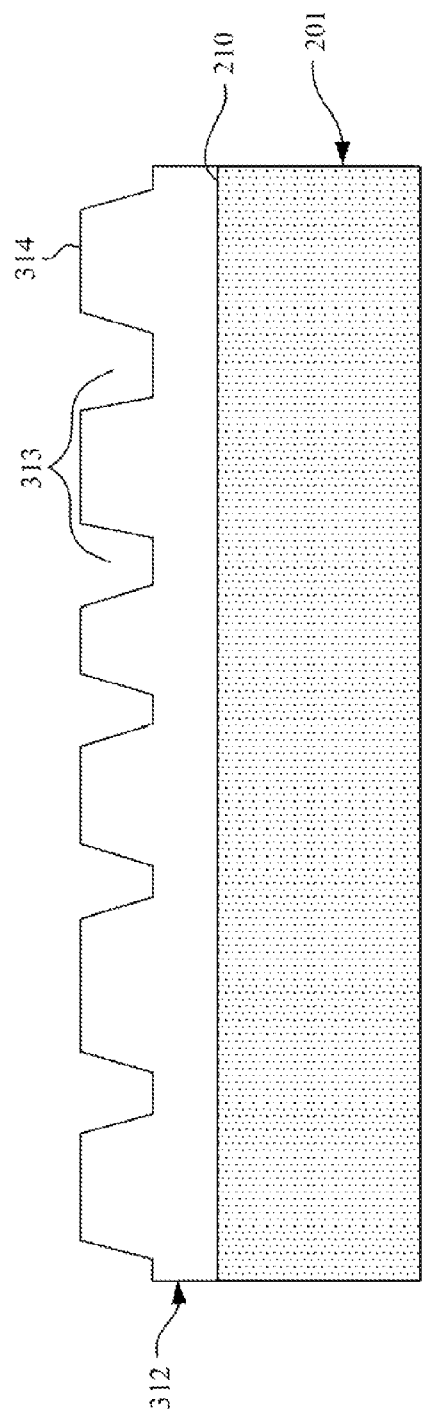

In Step (902), a first buffer layer 312 is formed on the top surface 210 of the substrate 201 in which the first buffer layer 312 is formed with a plurality of grooves 313 arranged at intervals on the surface opposite to the substrate 201 (as shown in FIG. 4A). In this step, the mentioned grooves 313 can be formed on the surface of the first buffer layer 312 opposite to the substrate 201 through a lithography etching means.

Figure 4B:
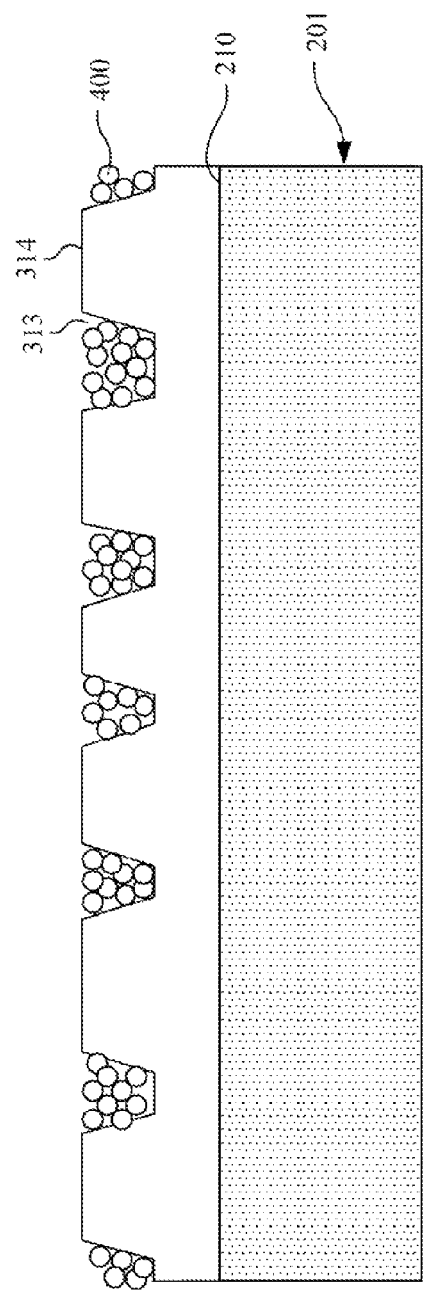

In Step (903), a plurality of nano-spheres 400 is arranged in each groove 313 (as shown in FIG. 4B). In this step, the nano-spheres 400 are in groups to be respectively dispose in each groove 313, and the detailed steps further comprise Step (9031) to Step (9034).

In Step (9031), a solution containing the nano-spheres 400 is applied on the top surface 210 of the first buffer layer 312;

in Step (9032), the substrate 201 and the first buffer layer 312 are rotated for making the nano-spheres 400 to respectively fall in the grooves 313;

in Step (9033), the residual nano-spheres 400 is brushed on the surface of the first buffer layer 312 for removing the residual nano-spheres 400, in which several nano-spheres 400 may be pushed to fall into the grooves 313 during the removing process; and In Step (9034), the solution is expected to be evaporated from the first buffer layer 312.

In Step (904), a second buffer layer 315 is formed on the first buffer layer 312 in which the second buffer layer 315 covers the grooves 313, the nano-spheres 400 and the first buffer layer 312 (as shown from FIG. 4C to FIG. 4E); substantially, because the grooves 313 of the first buffer layer 312 have already been provided with the nano-spheres 400, a plurality of second crystal growing surfaces 314 are formed at the staggering locations defined by the first buffer layer 312 and the grooves 313, the second buffer layer 315 is only allowed to epitaxy on the second crystal growing surfaces 314.

Figure 4E:
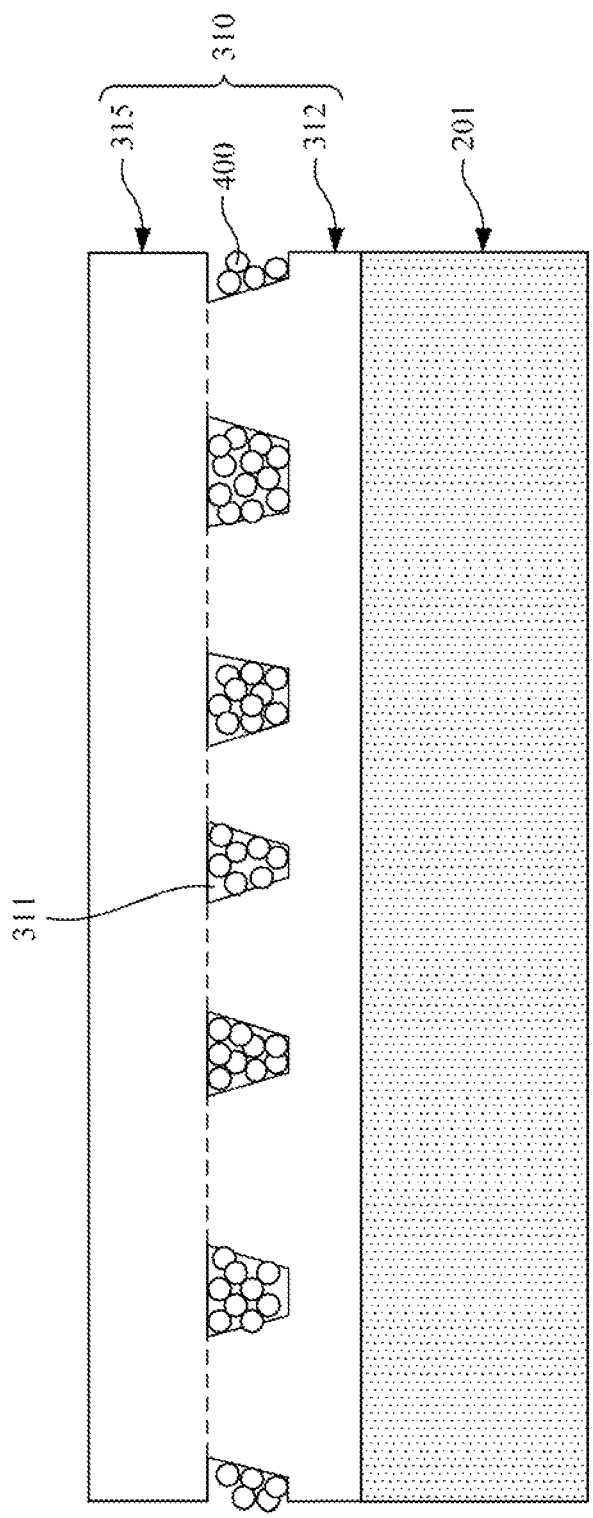

During the epitaxy process of the second buffer layer 315, initial crystals 302 of the second buffer layer 315 are respectively and transversally grown towards two opposite sides (see the crystal growing direction D3 towards left and right as shown in FIG. 4C) on the second crystal growing surfaces 314 of the first buffer layer 312, after the crystals 302 are transversally grown and formed as one piece and the channels 311 are formed in the grooves 313 (as shown in FIG. 4D), the crystals 302 are jointly grown towards the direction opposite to the substrate 201 as the crystal growing direction D4 shown in FIG. 4D, so as to form the second buffer layer 315 (as shown in FIG. 4E). As such, with the transversal epitaxy mechanism, the regular growth of the whole crystals of second buffer layer 315 can be enhanced so as to effectively improve the crystal quality of epitaxy.

Figure 4F:
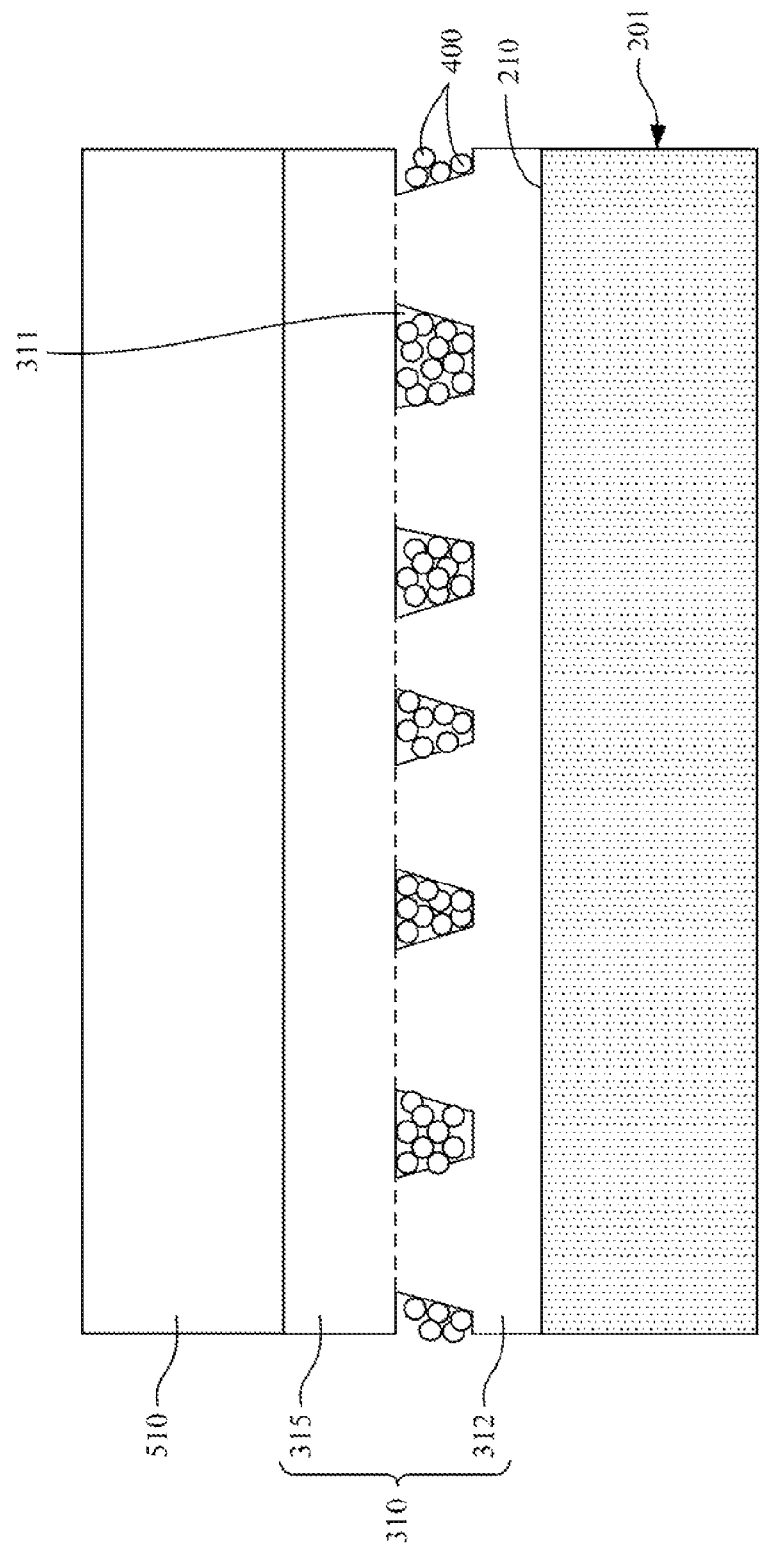

In Step (905), the mentioned first semiconductor layer 510 is formed on the surface of the second buffer layer 315 opposite to the substrate 201 (as shown in FIG. 4F).

Figure 4G:
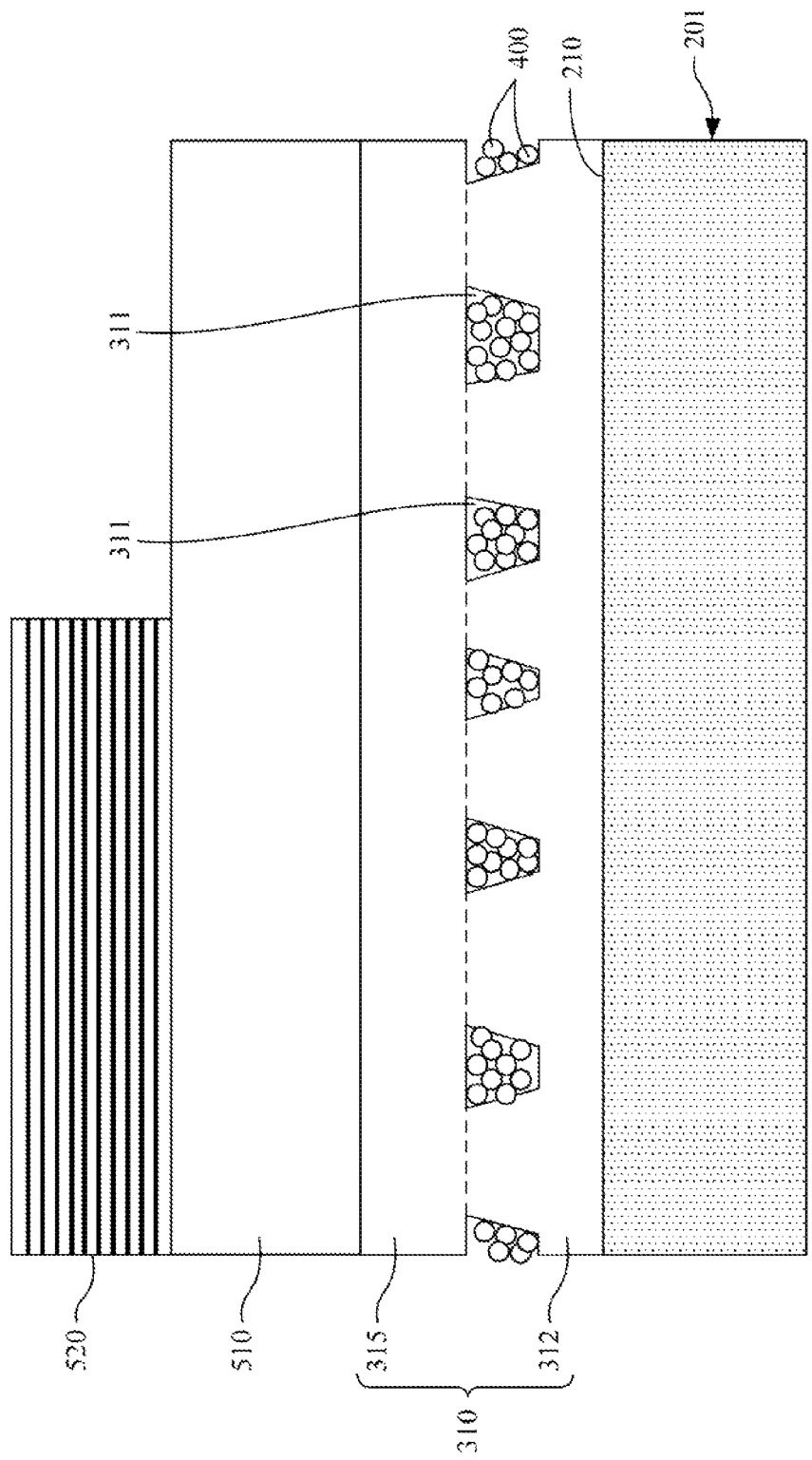

In Step (906), the mentioned light emitting layer 520 is formed on the surface of the first semiconductor layer 510 opposite to the substrate 201 (as shown in FIG. 4G).

In Step (907), the mentioned second semiconductor layer 530 is formed on the surface of the light emitting layer 520 opposite to the substrate 201 (as shown in FIG. 3).

In Step (908), the mentioned first electrode layer 600 is formed on the first semiconductor layer 510, and the mentioned second electrode layer 700 is formed on the second semiconductor layer 530, respectively (as shown in FIG. 3). Accordingly, with the disclosed steps, the LED element 101 of the second embodiment can be formed.

Figure 5:
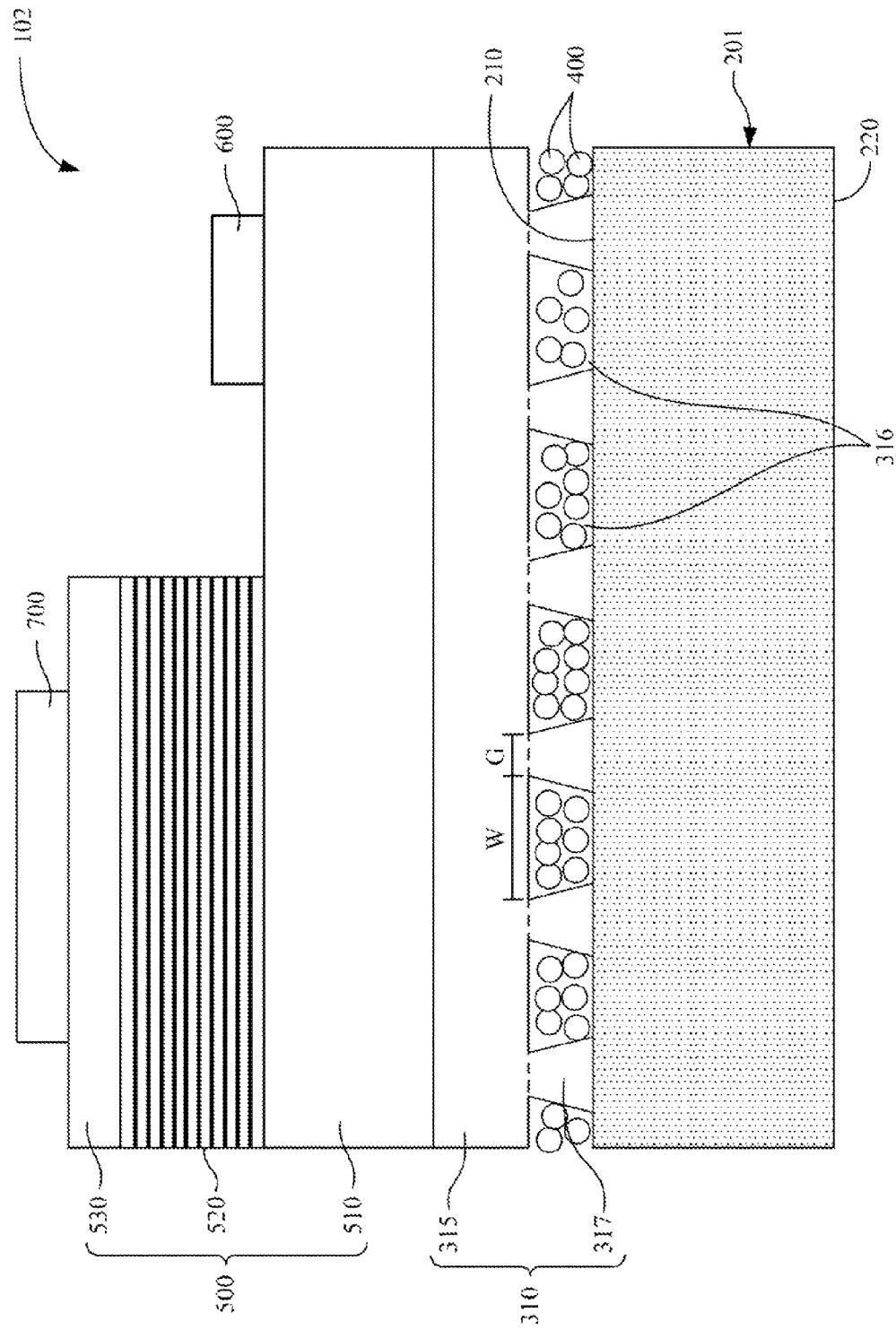
FIG. 5 is a side view showing the light emitting diode element according to one alternative of the second embodiment provided by the present invention.

Reference is first made to FIG. 5. FIG. 5 is a side view showing the LED element 102 according to one alternative of the second embodiment provided by the present invention.

According to one alternative of the second embodiment, the LED element 102 (or LED die) comprises a substrate 201, a buffer layer 310, a plurality of nano-spheres 400 and a light emitting structure 500. The buffer layer 310 is disposed on the substrate 201, and the buffer layer 310 is formed with a plurality of grooves 316 arranged at intervals on a surface thereof that faces the substrate 201. The nano-spheres 400 are received in the grooves 316. The light emitting structure 500 is formed on the buffer layer 310.

According to one alternative of the second embodiment, the substrate 201 is substantially the same as the substrate shown in FIG. 3. The grooves 316 are periodically or non-periodically arranged on the surface of the buffer layer 310 which faces of the substrate 201, in other words, the grooves 316 are periodically or non-periodically arranged on the top surface 210 of the substrate 201.

According to one alternative of the second embodiment, each groove 316 can be defined as a micrometer-class groove having the width W such as 1 μm, in which the width W is smaller than the interval G, e.g. 2 μm~3 μm, defined between every two adjacent grooves 316. However, the scope of the present invention is not limited to the disclosure, the width W of each groove 316 and the interval G defined between every two adjacent grooves 316 can be determined according to actual needs.

Substantially, the mentioned nano-spheres 400 are defined as in the nano size, so the nano-spheres 400 can also be named as nano-class spheres or microspheres. As such, the nano-spheres 400 can be respectively and in groups disposed in the grooves 316, so each groove 316 is provided with at least a nano-sphere 400.

The nano-spheres 400 are made of a dielectric material, e.g. a combination of $SiO_x$, $SiN_x$, $SiOH_x$, ceramics and $TiO_x$.

In addition, the diameter of each nano-sphere 400 is e.g. between 100 nm to 750 nm; preferably, the diameter of each nano-sphere 400 is between 100 nm to 500 nm; furthermore, the diameter of each nano-sphere 400 can be between 160 nm to 180 nm. The diameter of each nano-sphere 400 is similar to the wavelength of the output light beam emitted from the light emitting structure 500, wherein the wavelength of the output light beam emitted from the light emitting structure 500 is e.g. between 450~500 nm.

The light emitting structure 500, the first electrode layer 600 and the second electrode layer 700 are the same as what have been disclosed above and are provided with the same the numeral references, therefore no further illustration is provided. According to this alternative, the manufacturing procedure is similar to the Step (901) to the Step (908), only the Step (902) is different, when a first buffer layer 317 is formed on the top surface 210 of the substrate 201, the first buffer layer 317 comprises a plurality of through holes (not shown in figures) penetrating the first buffer layer 317, the through holes are arranged at intervals; the subsequent steps after Step (902) are the same as the Step (903) to the Step (908).

Figure 6:
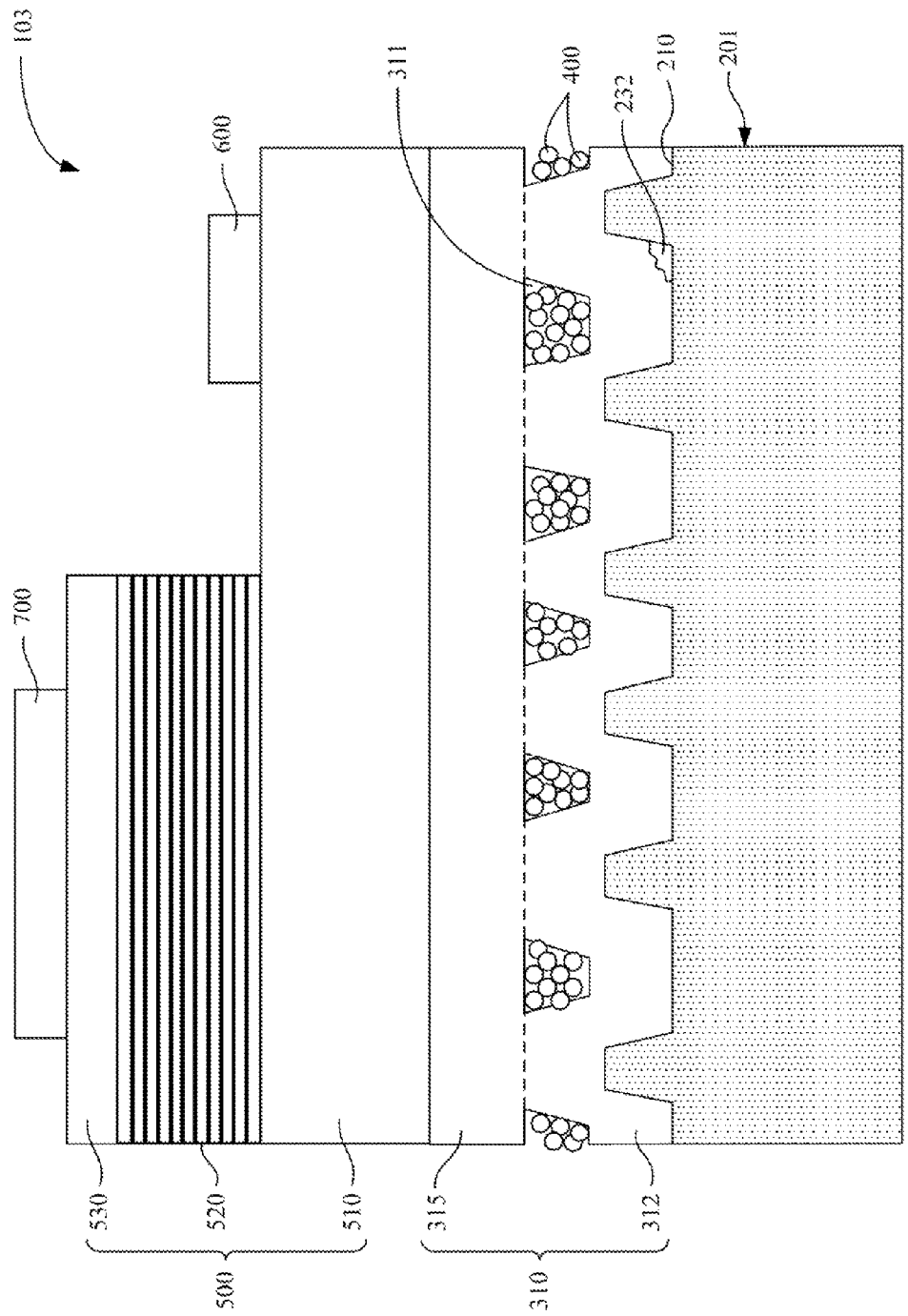
FIG. 6 is a side view showing the light emitting diode element according to another alternative of the second embodiment provided by the present invention.

FIG. 6 is a side view showing the LED element 103 according to another alternative of the second embodiment provided by the present invention.

The substrate 201 further comprises a plurality of grooves 232 arranged at intervals on the top surface 210 of the substrate 201 in which the buffer layer 300 (or the mentioned first buffer layer 312) fully fills the grooves 232 to cover the substrate 201 and the grooves 232.

Figure 7:
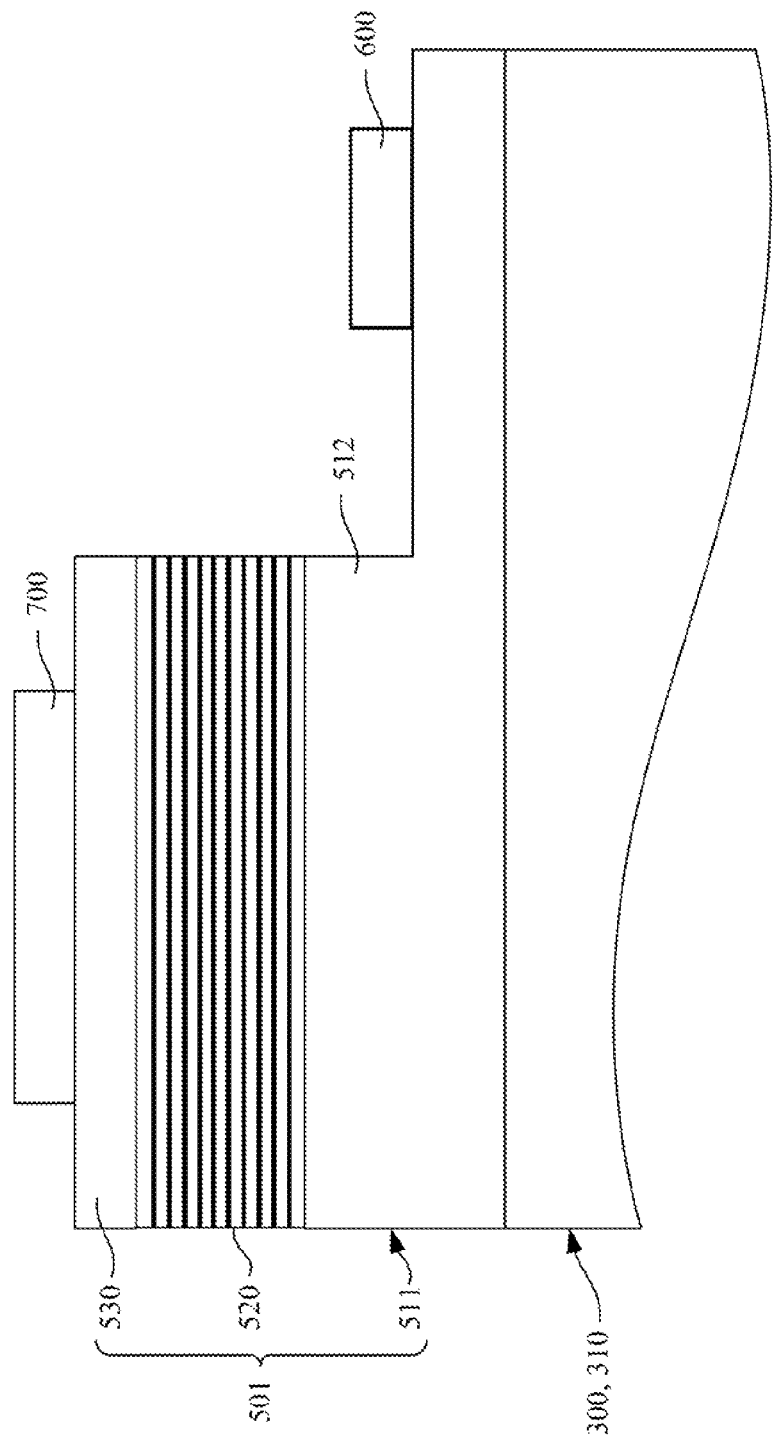
FIG. 7 is a side view showing the light emitting structure of the light emitting diode element according to one alternative of the first to the third embodiments provided by the present invention.

FIG. 7 is a side view showing the light emitting structure 501 of the LED elements 100, 101, 102, 103 according to one alternative of the first to the third embodiments provided by the present invention.

According to other alternatives of the mentioned embodiments, the light emitting structure 501 of the LED elements 100, 101, 102, 103 includes a first semiconductor layer 511, a light emitting layer 520 and a second semiconductor layer 530. The first semiconductor layer 511 is formed on the buffer layer 300, 310. The light emitting layer 520 is partially formed on a surface of the first semiconductor layer 511, thus, the other part of the first semiconductor layer 511 which is not covered by the light emitting layer 520 can be exposed outwardly. The second semiconductor layer 530 is formed on the light emitting layer 520.

Furthermore, the part of the surface of the first semiconductor layer 511 where the light emitting layer 520 formed is formed with a protruding member 512, the light emitting layer 520 is disposed on the protruding member 512. The protruding part 512 is higher than the other part of the first semiconductor layer 511 which is not covered by the light emitting layer 520.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

Although the present invention has been described with reference to the preferred embodiments thereof, it is apparent to those skilled in the art that a variety of modifications and changes may be made without departing from the scope of the present invention which is intended to be defined by the appended claims.

The readers attention is directed to all papers and documents which are filed concurrently with this specification and which are open to public inspection with this specification, and the contents of all such papers and documents are incorporated herein by reference.

All the features disclosed in this specification (comprising any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A light emitting diode element, comprising:
   a substrate having a plurality of grooves arranged at intervals on a surface of the substrate;
   a buffer layer stacked on a surface of the substrate where the grooves being formed, wherein the grooves are disposed between the substrate and the buffer layer;
   a plurality of nano-spheres received in the grooves, wherein each of the grooves is filled with the nano-spheres; and
   a light emitting structure stacked on the buffer layer.

2. The light emitting diode element according to claim 1, wherein the light emitting structure comprises:
   a first semiconductor layer formed on the buffer layer;
   a light emitting layer formed on a part of a surface of the first semiconductor layer, such that a remaining part of the surface of the first semiconductor layer which is not covered by the light emitting layer is exposed and
   a second semiconductor layer formed on the light emitting layer.

3. The light emitting diode element according to claim 2, wherein the part of the surface of the first semiconductor layer where the light emitting layer being formed is formed with a protruding member, and
   the protruding part is higher than the remaining part of the surface of the first semiconductor layer which is not covered by the light emitting layer.

4. The light em thing diode element according to claim 2 further comprising:
   a first electrode layer formed on the remains of the surface of the first semiconductor layer which is not covered by the light emitting layer; and
   a second electrode layer formed on the second semiconductor layer.

5. The light emitting diode element according to claim 2, wherein the first semiconductor layer s a N-type gallium-containing nitride semiconductor layer, the second semiconductor layer is a P-type gallium-containing nitride semiconductor layer; or
   the first semiconductor layer is a P-type gallium-containing nitride semiconductor layer, the second semiconductor layer is a N-type gallium-containing nitride semiconductor layer.

6. The light emitting diode element according to claim 1, wherein the grooves are periodically or non-periodically arranged on the substrate.

7. The light emitting diode element according to claim 1, wherein a width of each of the grooves is 1 µm.

8. The light emitting diode element according to claim 7, wherein the interval defined between each of the two adjacent grooves is 1 µm to 3 µm.

9. The light emitting diode element according to claim 1, wherein the light reflection rate of he nano-spheres is greater than 1.

10. The light emitting diode element according to claim 1, wherein the nano-spheres are made of a dielectric material.

11. The light emitting diode element according to claim 10, wherein the dielectric material is selected from a group consisted of $SiO_x$, $SiN_x$, $SiOH_x$, ceramics and $TiO_x$.

12. The light emitting diode element according to claim 1, wherein the diameter of each of the nano-spheres is between 100 nm to 500 nm.

13. The light emitting diode element according to claim 12 wherein the diameter of each of the nano-spheres is between 160 nm to 180 nm.

14. The light emitting diode element according to claim 1, wherein the wavelength of the output light beam emitted from the light emitting structure is between 450 to 500 nm.

15. A light emitting diode element, comprising:
   a substrate;
   a buffer layer formed with a plurality of grooves arranged at intervals on one surface thereof, and the surface faces the substrate for stacking on the substrate;
   a plurality of nano-spheres received in the grooves; and
   a light emitting structure formed on the buffer layer.

16. A light emitting diode element, comprising:
   a substrate;
   a buffer layer stacked on the substrate and provided with a plurality of channels arranged at intervals in the buffer layer;
   a plurality of nano-spheres received in the channels; and
   a light emitting structure formed on the buffer layer.

17. The light emitting diode element according to claim 16, wherein the channels are periodically or non-periodically arranged on the substrate.

18. The light emitting diode element according to claim 16, wherein a width of each of the channels is 1 µm.

19. The light emitting diode element according to claim 16, wherein the interval defined between each of the two adjacent channels is 1 µm to 3 µm.

20. The light emitting diode element according to claim 16, wherein a diameter of each of the nano-spheres is between 100 nm to 500 nm.

* * * * *